(12) United States Patent
Ekberg

(10) Patent No.: US 10,821,721 B2
(45) Date of Patent: Nov. 3, 2020

(54) METHOD FOR ANALYSING A BUILD LAYER

(71) Applicant: Arcam AB, Moelndal (SE)

(72) Inventor: Christian Ekberg, Hindas (SE)

(73) Assignee: Arcam AB, Moelndal (SE)

(*) Notice: Subject to any disclaimer, the term of this patent is extended or adjusted under 35 U.S.C. 154(b) by 116 days.

(21) Appl. No.: 16/154,444

(22) Filed: Oct. 8, 2018

(65) Prior Publication Data
US 2019/0160806 A1 May 30, 2019

Related U.S. Application Data

(60) Provisional application No. 62/590,909, filed on Nov. 27, 2017.

(51) Int. Cl.
*B33Y 50/02* (2015.01)
*B22F 3/105* (2006.01)
(Continued)

(52) U.S. Cl.
CPC ............ *B33Y 50/02* (2014.12); *B22F 3/1055* (2013.01); *B29C 64/153* (2017.08);
(Continued)

(58) Field of Classification Search
CPC ......... B33Y 50/02; B33Y 40/00; B33Y 30/00; B33Y 10/00; G06F 30/00; B29C 64/393;
(Continued)

(56) References Cited

U.S. PATENT DOCUMENTS 2,264,968 A 12/1941 De Forest
2,323,715 A 7/1943 Kuehni
(Continued)

FOREIGN PATENT DOCUMENTS

CA 2860188 A1 6/2006
CN 101607311 A 12/2009
(Continued)

OTHER PUBLICATIONS

Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.
(Continued)

*Primary Examiner* — Michael Maskell
(74) *Attorney, Agent, or Firm* — Dinsmore & Shohl LLP

(57) ABSTRACT

Described is a method for analyzing a build layer (1; 11) in an additive manufacturing machine when forming a three-dimensional article layer by layer by successive fusion of selected areas of powder layers, which selected areas correspond to successive layers of the three-dimensional article. The method comprises the steps of radiating a portion (4; 14) of the build layer (1; 11) by an energy beam and detecting particles emitted, backscattered or reflected from the radiated portion of the build layer, and scanning the portion (4; 14) of the build layer by moving the energy beam along a main path (5; 15) and simultaneously moving the energy beam back-and-forth across the main path in a meandering pattern (6; 16).

21 Claims, 7 Drawing Sheets

(51) Int. Cl.
    *B29C 64/153* (2017.01)
    *B29C 64/393* (2017.01)
    *G06F 30/00* (2020.01)
    *B33Y 10/00* (2015.01)
    *B33Y 30/00* (2015.01)
    *B33Y 40/00* (2020.01)

(52) U.S. Cl.
    CPC ............ *B29C 64/393* (2017.08); *B33Y 10/00* (2014.12); *B33Y 30/00* (2014.12); *B33Y 40/00* (2014.12); *G06F 30/00* (2020.01); *B22F 2003/1056* (2013.01)

(58) Field of Classification Search
    CPC ................ B29C 64/153; B22F 3/1055; B22F 2003/1056
    USPC ........... 250/306, 307, 310, 311, 492.1–492.3
    See application file for complete search history.

(56) References Cited

U.S. PATENT DOCUMENTS

| | | |
|---|---|---|
| 3,634,644 A | 1/1972 | Ogden et al. |
| 3,838,496 A | 10/1974 | Kelly |
| 3,882,477 A | 5/1975 | Mueller |
| 3,906,229 A | 9/1975 | Demeester et al. |
| 3,908,124 A | 9/1975 | Rose |
| 4,314,134 A | 2/1982 | Schumacher et al. |
| 4,348,576 A | 9/1982 | Anderl et al. |
| 4,352,565 A | 10/1982 | Rowe et al. |
| 4,401,719 A | 8/1983 | Kobayashi et al. |
| 4,541,055 A | 9/1985 | Wolfe et al. |
| 4,651,002 A | 3/1987 | Anno |
| 4,818,562 A | 4/1989 | Arcella et al. |
| 4,863,538 A | 9/1989 | Deckard |
| 4,888,490 A | 12/1989 | Bass et al. |
| 4,927,992 A | 5/1990 | Whitlow et al. |
| 4,958,431 A | 9/1990 | Clark et al. |
| 4,988,844 A | 1/1991 | Dietrich et al. |
| 5,118,192 A | 6/1992 | Chen et al. |
| 5,135,695 A | 8/1992 | Marcus |
| 5,151,571 A * | 9/1992 | Sanderson ......... B23K 15/0046 219/121.13 |
| 5,167,989 A | 12/1992 | Dudek et al. |
| 5,182,170 A | 1/1993 | Marcus et al. |
| 5,204,055 A | 4/1993 | Sachs et al. |
| 5,247,560 A | 9/1993 | Hosokawa et al. |
| 5,393,482 A | 2/1995 | Benda et al. |
| 5,483,036 A | 1/1996 | Giedt et al. |
| 5,508,489 A | 4/1996 | Benda et al. |
| 5,511,103 A | 4/1996 | Hasegawa |
| 5,595,670 A | 1/1997 | Mombo Caristan |
| 5,647,931 A | 7/1997 | Retallick et al. |
| 5,753,274 A | 5/1998 | Wilkening et al. |
| 5,837,960 A | 11/1998 | Lewis et al. |
| 5,876,550 A | 3/1999 | Feygin et al. |
| 5,904,890 A | 5/1999 | Lohner et al. |
| 5,932,290 A | 8/1999 | Lombardi et al. |
| 6,046,426 A | 4/2000 | Jeantette et al. |
| 6,162,378 A | 12/2000 | Bedal et al. |
| 6,204,469 B1 | 3/2001 | Fields et al. |
| 6,419,203 B1 | 7/2002 | Dang |
| 6,537,052 B1 | 3/2003 | Adler |
| 6,554,600 B1 | 4/2003 | Hofmann et al. |
| 6,583,379 B1 | 6/2003 | Meiners et al. |
| 6,676,892 B2 | 1/2004 | Das et al. |
| 6,724,001 B1 | 4/2004 | Pinckney et al. |
| 6,746,506 B2 | 6/2004 | Liu et al. |
| 6,751,516 B1 | 6/2004 | Richardson |
| 6,764,636 B1 | 7/2004 | Allanic et al. |
| 6,811,744 B2 | 11/2004 | Keicher et al. |
| 6,815,636 B2 | 11/2004 | Chung et al. |
| 6,824,714 B1 | 11/2004 | Türck et al. |
| 7,003,864 B2 | 2/2006 | Dirscherl |
| 7,020,539 B1 | 3/2006 | Kovacevic et al. |
| 7,165,498 B2 | 1/2007 | Mackrill et al. |
| 7,204,684 B2 | 4/2007 | Ederer et al. |
| 7,291,002 B2 | 11/2007 | Russell et al. |
| 7,452,500 B2 | 11/2008 | Uckelmann |
| 7,454,262 B2 | 11/2008 | Larsson et al. |
| 7,537,722 B2 | 5/2009 | Andersson et al. |
| 7,540,738 B2 | 6/2009 | Larsson et al. |
| 7,569,174 B2 | 8/2009 | Ruatta et al. |
| 7,635,825 B2 | 12/2009 | Larsson |
| 7,686,605 B2 | 3/2010 | Perret et al. |
| 7,696,501 B2 | 4/2010 | Jones |
| 7,713,454 B2 | 5/2010 | Larsson |
| 7,754,135 B2 | 7/2010 | Abe et al. |
| 7,799,253 B2 | 9/2010 | Höchsmann et al. |
| 7,871,551 B2 | 1/2011 | Wallgren et al. |
| 8,021,138 B2 | 9/2011 | Green |
| 8,083,513 B2 | 12/2011 | Montero-Escuder et al. |
| 8,137,739 B2 | 3/2012 | Philippi et al. |
| 8,187,521 B2 | 5/2012 | Larsson et al. |
| 8,308,466 B2 | 11/2012 | Ackelid et al. |
| 8,992,816 B2 | 3/2015 | Jonasson et al. |
| 9,073,265 B2 | 7/2015 | Snis |
| 9,079,248 B2 | 7/2015 | Ackelid |
| 9,126,167 B2 | 9/2015 | Ljungblad |
| 9,254,535 B2 | 2/2016 | Buller et al. |
| 9,310,188 B2 | 4/2016 | Snis |
| 9,505,172 B2 | 11/2016 | Ljungblad |
| 9,550,207 B2 | 1/2017 | Ackelid |
| 9,802,253 B2 | 10/2017 | Jonasson |
| 9,950,367 B2 | 4/2018 | Backlund et al. |
| 10,071,422 B2 | 9/2018 | Buller et al. |
| 10,144,063 B2 * | 12/2018 | Ljungblad ............. B32B 15/013 |
| 2002/0104973 A1 | 8/2002 | Kerekes |
| 2002/0152002 A1 | 10/2002 | Lindemann et al. |
| 2002/0195747 A1 | 12/2002 | Hull et al. |
| 2003/0043360 A1 | 3/2003 | Farnworth |
| 2003/0133822 A1 | 7/2003 | Harryson |
| 2003/0205851 A1 | 11/2003 | Laschutza et al. |
| 2004/0012124 A1 | 1/2004 | Li et al. |
| 2004/0026807 A1 | 2/2004 | Andersson et al. |
| 2004/0084814 A1 | 5/2004 | Boyd et al. |
| 2004/0104499 A1 | 6/2004 | Keller |
| 2004/0148048 A1 | 7/2004 | Farnworth |
| 2004/0173496 A1 | 9/2004 | Srinivasan |
| 2004/0173946 A1 | 9/2004 | Pfeifer et al. |
| 2004/0204765 A1 | 10/2004 | Fenning et al. |
| 2004/0217095 A1 | 11/2004 | Herzog |
| 2005/0173380 A1 | 8/2005 | Carbone |
| 2005/0186538 A1 | 8/2005 | Uckelmann |
| 2005/0282300 A1 | 12/2005 | Yun et al. |
| 2006/0108712 A1 | 5/2006 | Mattes |
| 2006/0138325 A1 | 6/2006 | Choi |
| 2006/0145381 A1 | 7/2006 | Larsson |
| 2006/0147332 A1 | 7/2006 | Jones et al. |
| 2006/0157892 A1 | 7/2006 | Larsson |
| 2006/0180957 A1 | 8/2006 | Hopkinson et al. |
| 2006/0284088 A1 | 12/2006 | Fukunaga et al. |
| 2007/0074659 A1 | 4/2007 | Wahlstrom |
| 2007/0175875 A1 | 8/2007 | Uckelmann et al. |
| 2007/0179655 A1 | 8/2007 | Farnworth |
| 2007/0182289 A1 | 8/2007 | Kigawa et al. |
| 2007/0298182 A1 | 12/2007 | Perret et al. |
| 2008/0236738 A1 | 10/2008 | Lo et al. |
| 2009/0017219 A1 | 1/2009 | Paasche et al. |
| 2009/0152771 A1 | 6/2009 | Philippi et al. |
| 2009/0206056 A1 | 8/2009 | Xu et al. |
| 2010/0007062 A1 | 1/2010 | Larsson et al. |
| 2010/0260410 A1 | 10/2010 | Taminger et al. |
| 2010/0270274 A1 * | 10/2010 | Taminger ............... B23K 15/02 219/121.17 |
| 2010/0305743 A1 | 12/2010 | Larsson |
| 2010/0310404 A1 | 12/2010 | Ackelid |
| 2010/0316856 A1 | 12/2010 | Currie et al. |
| 2011/0061591 A1 | 3/2011 | Stecker |
| 2011/0114839 A1 * | 5/2011 | Stecker ................ B22F 3/1055 250/307 |
| 2011/0133367 A1 | 6/2011 | Weidinger et al. |
| 2011/0240607 A1 | 10/2011 | Stecker et al. |
| 2011/0241575 A1 | 10/2011 | Caiafa et al. |

(56) References Cited

U.S. PATENT DOCUMENTS

| | | |
|---|---|---|
| 2011/0293770 A1 | 12/2011 | Ackelid et al. |
| 2011/0293771 A1 | 12/2011 | Oberhofer et al. |
| 2011/0309554 A1 | 12/2011 | Liska et al. |
| 2011/0316178 A1 | 12/2011 | Uckelmann |
| 2012/0100031 A1 | 4/2012 | Ljungblad |
| 2012/0164322 A1 | 6/2012 | Teulet et al. |
| 2012/0183701 A1 | 7/2012 | Pilz et al. |
| 2012/0193530 A1 | 8/2012 | Parker et al. |
| 2012/0211155 A1 | 8/2012 | Wehning et al. |
| 2012/0223059 A1 | 9/2012 | Ackelid |
| 2012/0225210 A1 | 9/2012 | Fruth |
| 2012/0237745 A1 | 9/2012 | Dierkes et al. |
| 2012/0266815 A1 | 10/2012 | Brunermer |
| 2013/0055568 A1* | 3/2013 | Dusel ............... B22F 3/1055 29/888.02 |
| 2013/0162134 A1 | 6/2013 | Mattausch et al. |
| 2013/0186514 A1 | 7/2013 | Zhuang et al. |
| 2013/0216959 A1 | 8/2013 | Tanaka et al. |
| 2013/0233846 A1 | 9/2013 | Jakimov et al. |
| 2013/0264750 A1 | 10/2013 | Hofacker et al. |
| 2013/0270750 A1 | 10/2013 | Green |
| 2013/0278920 A1 | 10/2013 | Loewgren |
| 2013/0300286 A1 | 11/2013 | Ljungblad et al. |
| 2013/0343947 A1 | 12/2013 | Satzger et al. |
| 2014/0175708 A1 | 6/2014 | Echigo et al. |
| 2014/0271964 A1 | 9/2014 | Roberts, IV et al. |
| 2014/0301884 A1 | 10/2014 | Hellestam et al. |
| 2014/0308153 A1 | 10/2014 | Ljungblad |
| 2014/0314609 A1 | 10/2014 | Ljungblad et al. |
| 2014/0314964 A1 | 10/2014 | Ackelid |
| 2014/0348691 A1 | 11/2014 | Ljungblad et al. |
| 2014/0363327 A1 | 12/2014 | Holcomb |
| 2014/0367367 A1 | 12/2014 | Wood et al. |
| 2015/0004045 A1 | 1/2015 | Ljungblad |
| 2015/0050463 A1 | 2/2015 | Nakano et al. |
| 2015/0071809 A1 | 3/2015 | Nordkvist et al. |
| 2015/0086409 A1 | 3/2015 | Hellestam |
| 2015/0088295 A1 | 3/2015 | Hellestam |
| 2015/0130118 A1 | 5/2015 | Cheng et al. |
| 2015/0139849 A1 | 5/2015 | Pialot, Jr. et al. |
| 2015/0151490 A1 | 6/2015 | Jonasson et al. |
| 2015/0165524 A1 | 6/2015 | Ljungblad et al. |
| 2015/0165525 A1 | 6/2015 | Jonasson |
| 2015/0174658 A1 | 6/2015 | Ljungblad |
| 2015/0174695 A1 | 6/2015 | Elfstroem et al. |
| 2015/0251249 A1 | 9/2015 | Fager |
| 2015/0270088 A1* | 9/2015 | Satoh ............... B23K 15/002 315/107 |
| 2015/0273622 A1 | 10/2015 | Manabe |
| 2015/0283610 A1 | 10/2015 | Ljungblad et al. |
| 2015/0283613 A1 | 10/2015 | Backlund et al. |
| 2015/0290710 A1 | 10/2015 | Ackelid |
| 2015/0306819 A1 | 10/2015 | Ljungblad |
| 2016/0052056 A1 | 2/2016 | Fager |
| 2016/0052079 A1 | 2/2016 | Ackelid |
| 2016/0054115 A1 | 2/2016 | Snis |
| 2016/0054121 A1 | 2/2016 | Snis |
| 2016/0054347 A1 | 2/2016 | Snis |
| 2016/0059314 A1 | 3/2016 | Ljungblad et al. |
| 2016/0129501 A1 | 5/2016 | Loewgren et al. |
| 2016/0167160 A1 | 6/2016 | Hellestam |
| 2016/0167303 A1 | 6/2016 | Petelet |
| 2016/0202042 A1 | 7/2016 | Snis |
| 2016/0202043 A1 | 7/2016 | Snis |
| 2016/0211116 A1 | 7/2016 | Lock |
| 2016/0236279 A1 | 8/2016 | Ashton et al. |
| 2016/0279735 A1 | 9/2016 | Hellestam |
| 2016/0282848 A1 | 9/2016 | Hellestam |
| 2016/0303687 A1 | 10/2016 | Ljungblad |
| 2016/0307731 A1 | 10/2016 | Lock |
| 2016/0311021 A1 | 10/2016 | Elfstroem et al. |
| 2017/0080494 A1 | 3/2017 | Ackelid |
| 2017/0087661 A1 | 3/2017 | Backlund et al. |
| 2017/0106443 A1 | 4/2017 | Karlsson |
| 2017/0106570 A1 | 4/2017 | Karlsson |
| 2017/0136541 A1 | 5/2017 | Fager |
| 2017/0136542 A1 | 5/2017 | Nordkvist et al. |
| 2017/0173691 A1 | 6/2017 | Jonasson |
| 2017/0189964 A1 | 7/2017 | Backlund et al. |
| 2017/0227417 A1 | 8/2017 | Snis |
| 2017/0227418 A1 | 8/2017 | Snis |
| 2017/0246684 A1 | 8/2017 | Hellestam |
| 2017/0246685 A1 | 8/2017 | Hellestam |
| 2017/0259338 A1 | 9/2017 | Ackelid |
| 2017/0274599 A1 | 9/2017 | Kitamura |
| 2017/0282248 A1 | 10/2017 | Ljungblad et al. |
| 2017/0294288 A1 | 10/2017 | Lock |
| 2017/0341141 A1 | 11/2017 | Ackelid |
| 2017/0341142 A1 | 11/2017 | Ackelid |
| 2017/0348791 A1 | 12/2017 | Ekberg |
| 2017/0348792 A1 | 12/2017 | Fager |
| 2018/0009033 A1 | 1/2018 | Fager |
| 2018/0154444 A1 | 6/2018 | Jonasson |
| 2019/0047077 A1* | 2/2019 | Comunale ............ B23K 15/004 |

FOREIGN PATENT DOCUMENTS

| | | |
|---|---|---|
| CN | 101635210 A | 1/2010 |
| CN | 201693176 U | 1/2011 |
| CN | 101607311 B | 9/2011 |
| CN | 203509463 U | 4/2014 |
| DE | 19952998 A1 | 5/2001 |
| DE | 20305843 U1 | 7/2003 |
| DE | 10235434 A1 | 2/2004 |
| DE | 102005014483 A1 | 10/2006 |
| DE | 202008005417 U1 | 8/2008 |
| DE | 102007018601 A1 | 10/2008 |
| DE | 102007029052 A1 | 1/2009 |
| DE | 102008012064 A1 | 9/2009 |
| DE | 102010041284 A1 | 3/2012 |
| DE | 102011105045 B3 | 6/2012 |
| DE | 102013210242 A1 | 12/2014 |
| EP | 0289116 A1 | 11/1988 |
| EP | 0322257 A2 | 6/1989 |
| EP | 0688262 A1 | 12/1995 |
| EP | 1358994 A1 | 11/2003 |
| EP | 1418013 A1 | 5/2004 |
| EP | 1466718 A2 | 10/2004 |
| EP | 1486318 A2 | 12/2004 |
| EP | 1669143 A1 | 6/2006 |
| EP | 1683593 A2 | 7/2006 |
| EP | 1721725 A1 | 11/2006 |
| EP | 1752240 A1 | 2/2007 |
| EP | 1952932 A2 | 8/2008 |
| EP | 2011631 A1 | 1/2009 |
| EP | 2119530 A1 | 11/2009 |
| EP | 2281677 A1 | 2/2011 |
| EP | 2289652 A1 | 3/2011 |
| EP | 2292357 A1 | 3/2011 |
| EP | 2832473 A1 | 2/2015 |
| EP | 2832474 A1 | 2/2015 |
| FR | 2980380 A1 | 3/2013 |
| JP | H05-171423 A | 7/1993 |
| JP | 2003241394 A | 8/2003 |
| JP | 2003245981 | 9/2003 |
| JP | 2009006509 A | 1/2009 |
| SE | 524467 C2 | 8/2004 |
| WO | WO 1993/08928 A1 | 5/1993 |
| WO | WO 1996/012607 A1 | 5/1996 |
| WO | WO 1997/37523 A2 | 10/1997 |
| WO | WO 2001/081031 A1 | 11/2001 |
| WO | WO 2001/85386 A2 | 11/2001 |
| WO | WO 2002/008653 A1 | 1/2002 |
| WO | WO 2004/007124 A1 | 1/2004 |
| WO | WO 2004/043680 A2 | 5/2004 |
| WO | WO 2004/054743 A1 | 7/2004 |
| WO | WO 2004/056511 A1 | 7/2004 |
| WO | WO 2004/106041 A2 | 12/2004 |
| WO | WO 2004/108398 A1 | 12/2004 |
| WO | WO 2006/091097 A2 | 8/2006 |
| WO | WO 2006/121374 A1 | 11/2006 |
| WO | WO 2007/112808 A1 | 10/2007 |
| WO | WO 2007/147221 A1 | 12/2007 |
| WO | WO 2008/013483 A1 | 1/2008 |

(56) References Cited

FOREIGN PATENT DOCUMENTS

| | | |
|---|---|---|
| WO | WO 2008/057844 A1 | 5/2008 |
| WO | WO 2008/074287 A1 | 6/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |
| WO | WO 2010/095987 A1 | 8/2010 |
| WO | WO 2010/125371 A1 | 11/2010 |
| WO | WO 2011/008143 A1 | 1/2011 |
| WO | WO 2011/011818 A1 | 2/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/092997 A1 | 6/2013 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2013/178825 A2 | 12/2013 |
| WO | WO 2014/071968 A1 | 5/2014 |
| WO | WO 2014/092651 A1 | 6/2014 |
| WO | WO 2014/095200 A1 | 6/2014 |
| WO | WO 2014/095208 A1 | 6/2014 |
| WO | WO 2014/195068 A1 | 12/2014 |
| WO | WO 2015/032590 A2 | 3/2015 |
| WO | WO 2015/091813 A1 | 6/2015 |
| WO | WO 2015/120168 A1 | 8/2015 |
| WO | WO 2015/142492 A1 | 9/2015 |

OTHER PUBLICATIONS

Gibson, D.W., et al., "Additive Manufacturing Technologies: Rapid Prototyping to Direct Digital Manufacturing", 2010, pp. 126-129, Springer, New York.

Guibas, Leonidas J., et al., "Randomized Incremental Construction of Delaunay and Voronoi Diagrams", Algorithmica, Jun. 1992, pp. 381-413, vol. 7, Issue 1-6, Springer-Verlag, New York.

Klassen, Alexander, et al., "Modelling of Electron Beam Absorption in Complex Geometries", *Journal of Physics D: Applied Physics*, Jan. 15, 2014, 12 pages, vol. 47, No. 6, Institute of Physics Publishing Ltd., Great Britain.

Motojima, Seiji, et al., "Chemical Vapor Growth of LaB6 Whiskers and Crystals Having a Sharp Tip", Journal of Crystal Growth, vol. 44, No. 1, Aug. 1, 1978 (Aug. 1, 1978), pp. 106-109.

Weigel, TH., et al., "Design and Preparation of Polymeric Scaffolds for Tissue Engineering," Expert Rev. Med. Devices, 2006, pp. 835-851, vol. 3, No. 6, XP002691485.

Yang, et al., "The Design of Scaffolds for Use in Tissue Engineering, Part II, Rapid Prototyping Techniques", Tissue Engineering, 2002, pp. 1-11, vol. 8, No. 1, XP002691484.

International Search Report and Written Opinion for application PCT/EP2018/082590 dated Feb. 5, 2019 (10 pages).

\* cited by examiner

METHOD FOR ANALYSING A BUILD LAYER

CROSS REFERENCE TO RELATED APPLICATIONS

This application claims benefit of U.S. Provisional Patent Application No. 62/590,909, filed on Nov. 27, 2017, the contents of which as are hereby incorporated by reference in their entirety.

BACKGROUND

Related Field

The invention relates to a method for analysing a build layer in an additive manufacturing machine when forming a three-dimensional article layer by layer by successive fusion of selected areas of powder layers, which selected areas correspond to successive layers of the three-dimensional article. In addition, the invention relates to a control unit for controlling an energy beam for analysing such a build layer.

Description of Related Art

Freeform fabrication or additive manufacturing (AM) using electron beam melting (EBM) or laser beam melting is a method for forming a solid three-dimensional article from a powder. The three-dimensional article is formed layer by layer by successive fusion of selected areas of powder layers, which selected areas correspond to successive layers of the three-dimensional article. A layer of powder, such as metal powder, is deposited on a build area and an electron beam or a laser beam is used to selectively melt the powder layer of the build area. The melted material fuses with underlaying layers and solidifies to form the top layer of the solid three-dimensional article. A further layer of powder is deposited onto the previous layer, and the electron or laser beam is used to selectively melt the further powder layer of the build area. The melted material solidifies and form another solid layer fused onto the previous solid layer. This process is repeated for multiple layers until the desired 3D geometry of the article is achieved.

An apparatus for forming such a three-dimensional article has a build plate on which the three-dimensional article is to be formed, a powder distributor device for delivering powder to the build plate (build area) for the formation of the powder layers and an electron beam source or a laser beam source for providing the energy beam used for melting the powder. Further, a control unit is used for controlling the energy beam to melt the selected areas of the powder layers.

During manufacturing by an AM machine, errors resulting in material defects or even delamination of the component may occur under unfavorable conditions. For example, uneven powder distribution in a powder layer can result in defects in the final product. One way of detecting such material defects or anomalies is to use an electron beam for scanning a solid portion of a build layer and a back-scatter detector for receiving backscattered electrons from the build layer. Such detecting methods tend however to extend the lead time for manufacturing the product.

BRIEF SUMMARY

Having this background, an object of the invention is to provide a method for analysing a build layer, by which method the time required for analysing a surface can be reduced.

The objective is achieved by a method for analysing a build layer in an additive manufacturing machine when forming a three-dimensional article layer by layer by successive fusion of selected areas of powder layers, which selected areas correspond to successive layers of the three-dimensional article, which method comprises the steps of radiating a portion of the build layer by an energy beam and detecting particles emitted, backscattered or reflected from the radiated portion of the build layer, and scanning the portion of the build layer by moving the energy beam along a main path and simultaneously moving the energy beam back-and-forth across the main path in a meandering pattern.

The scanning in a meandering pattern is preferably performed by controlling the deflection of the energy beam. In other words; the point of the energy beam focused on the build layer surface is moved along a meandering pattern. The energy beam can be for example an electron beam or a laser beam.

Various embodiments of the invention are based on the insight that by using a meandering pattern, incremental steps of the control signal for controlling deflection amplifiers of an electron beam source can be used at the same time as the surface of the build layer portion is properly scanned. Such relatively small incremental changes of the control signal make it possible to utilise the full small signal bandwidth of the deflection amplifiers to drive the deflection coils, thereby avoiding the limitations in rise time, settling time, phase shift and the lower signal bandwidth that are associated with large amplitude changes of the control signal to the deflection amplifiers. Thus, the time for reaching a set value for the deflection coil current and the settling time of the deflection amplifiers can be minimized or at least decreased. By avoiding delays in the positioning of the beam due to inertia in deflection coils or actuators the data sampling speed of scanning positions can be improved. This in turn will significantly reduce the scanning time required for the analysis.

Although the invention described via various embodiments herein is mainly exemplified by scanning with an electron beam, the invention can be applied for other types of energy beam, such as a laser beam. When scanning with a laser beam, actuators and drivers of a laser deflection unit can be controlled with incremental steps of the control signal in a corresponding way with similar advantages.

Due to the reduced scanning time, a surface can be analysed without extending the manufacturing time of the product in an unreasonable way which otherwise would make such in-situ analysis impossible. For example, by measuring key parameters, such as thickness and density of the powder layer, process actions or adjustments can be performed to counteract or prevent, or at least mitigate an uneven powder distribution for avoiding material defects in the component.

It should be stressed that when radiating a portion of the build layer, depending on the current analysis this portion can be constituted by non-melted powder, bonded powder or previously melted powder that has solidified. Thus, the portion to be scanned by the energy beam can be powder or solid material of the article being manufactured.

Further, for detecting the particles a particle detector device is selected and adapted to the particles to be detected which in turn depends on the energy beam used and the current analysis. The particles emitted, backscattered or reflected from the radiated portion of the build layer to be detected, can be for example one or more of back-scattered electrons originating from the electron beam, secondary electrons emitted from the material of the build layer, Auger electrons, reflected or backscattered photons from the laser beam, emitted photons, x-rays, etc. Thus, the term "particle" is used for covering massless particles too, such as photons or in other words electromagnetic radiation.

Although the meandering pattern could be intermittent, preferably the method comprises the step of moving the energy beam in a continuous meandering pattern. Hereby, the control of the energy beam will be simplified. In addition, due to the use of the meandering pattern substantially all scanning positions will be useful for the analysis.

According to at least one embodiment, the method comprises the step of moving the energy beam in alternating directions in parallel vectors crossing the main path, and preferably moving the energy beam in the parallel vectors being orthogonal to the direction of the main path. By sizing the vectors (scan lines) properly, only the area of interest has to be scanned. Further, the vectors can be separated by a predetermined distance giving a detection resolution sufficient to identify important defects. Thus, the scanning can be optimized still using small incremental steps of the control signal to the deflection amplifiers.

According to another exemplary embodiment, the method comprises the step of detecting secondary electrons emitted from the build layer. Hereby, the surface of the build layer can be analysed for determining the topography of the surface and/or for creating pictures of the surface, for instance.

According to a further exemplary embodiment, the method comprises the step of moving the energy beam such that a non-melted section of the build layer is radiated for detecting particles emitted, backscattered or reflected from the non-melted section. Hereby, defects or anomalies in a solid layer can be avoided by checking a powder layer and improving the powder distribution if needed before melting of the powder.

According to yet another further exemplary embodiment, the method comprises the step of moving the energy beam such that a previously melted and solidified section of the build layer is radiated for detecting particles emitted, backscattered or reflected from the previously melted and solidified section. Hereby, any defects or anomalies in a solid layer can be identified and actions can be taken if needed, such as re-melting of the solid layer for elimination of defects.

According to a still further embodiment, the method comprises the step of moving the energy beam along the main path being selected on the basis of a boundary between a previously melted section and a non-melted section of the build layer, and preferably the main path substantially follows the boundary. Hereby, the scanning can be directed to the most important parts of the build layer since the occurrence of defects or anomalies tends to be relatively high close to a boundary between solid material and powder. The scanning time can be further reduced as well as the data volume to be treated.

According to another exemplary embodiment, the method comprises the step of moving the energy beam along the main path being selected on the basis of a path along which an electron beam or a laser beam has been previously moved for melting the build layer, and preferably the main path substantially follows a path along which an electron beam or a laser beam has been previously moved for melting the powder. Hereby, the control of the energy beam will be simplified and the time for performing the analysis can be further decreased.

According to another aspect of various embodiments of the invention, a further objective is to provide a control unit for controlling an energy beam in an additive manufacturing machine, by which control unit the time required for analysing a surface can be reduced. This objective is achieved by a control unit for controlling an energy beam for analysing a build layer by radiating a portion of the build layer by the energy beam and detecting particles emitted, backscattered or reflected from the radiated portion of the build layer, where the control unit is configured to control the energy beam to move along a main path and simultaneously back-and-forth across the main path in a meandering pattern.

In addition, various embodiments of the invention relate to an arrangement for an additive manufacturing machine comprising such a control unit and a particle detector device, and to a computer program comprising program code means for performing a method according to the invention. The advantages of the control unit, the arrangement for an additive manufacturing machine and the computer program are similar to the advantages already discussed hereinabove with reference to the different embodiments of the method.

Further advantages and advantageous features of the invention are disclosed in the following description and in the claims provided herein.

BRIEF DESCRIPTION OF THE SEVERAL VIEWS OF THE DRAWINGS

Figure 1:
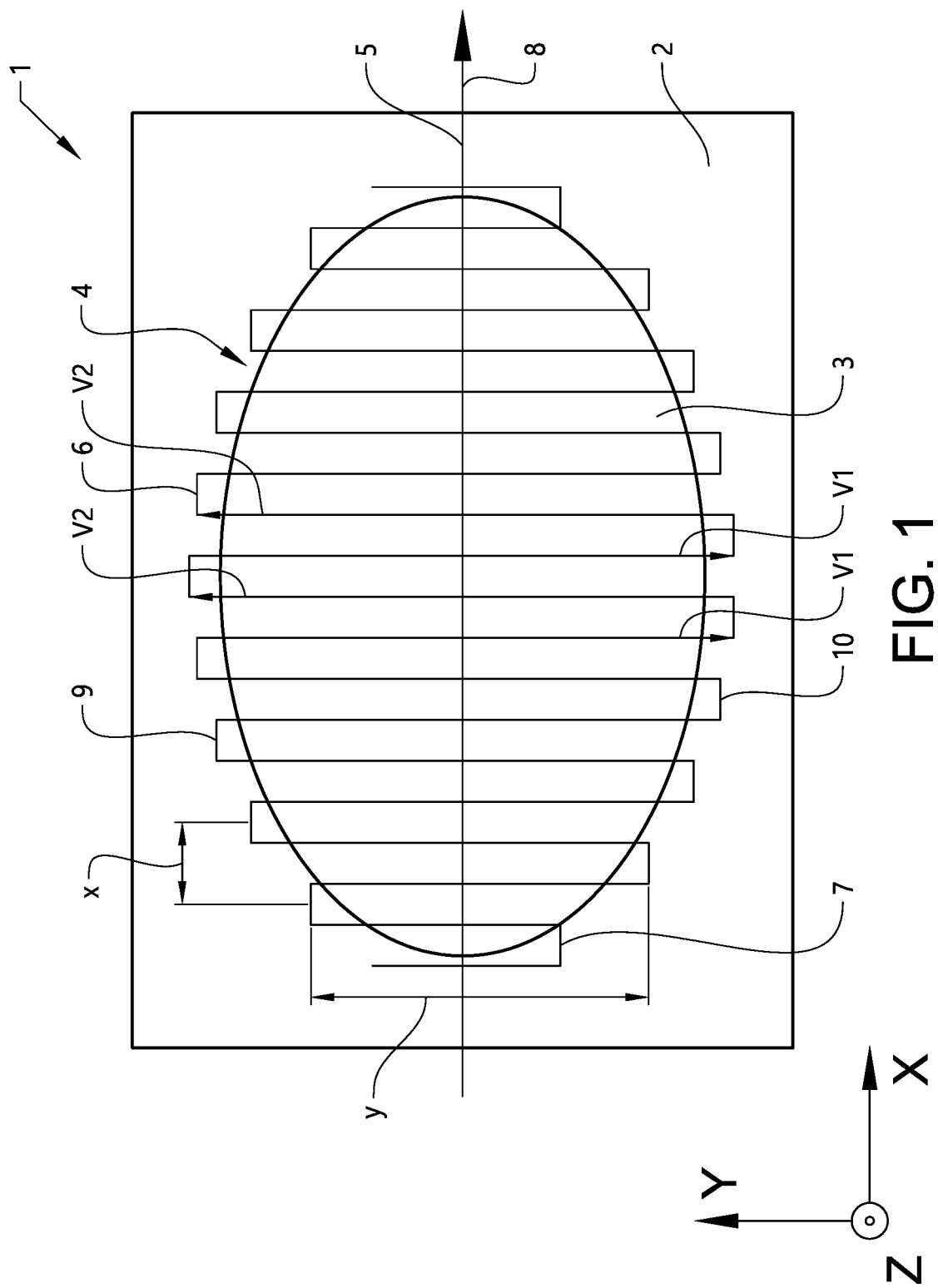
Figure 2:
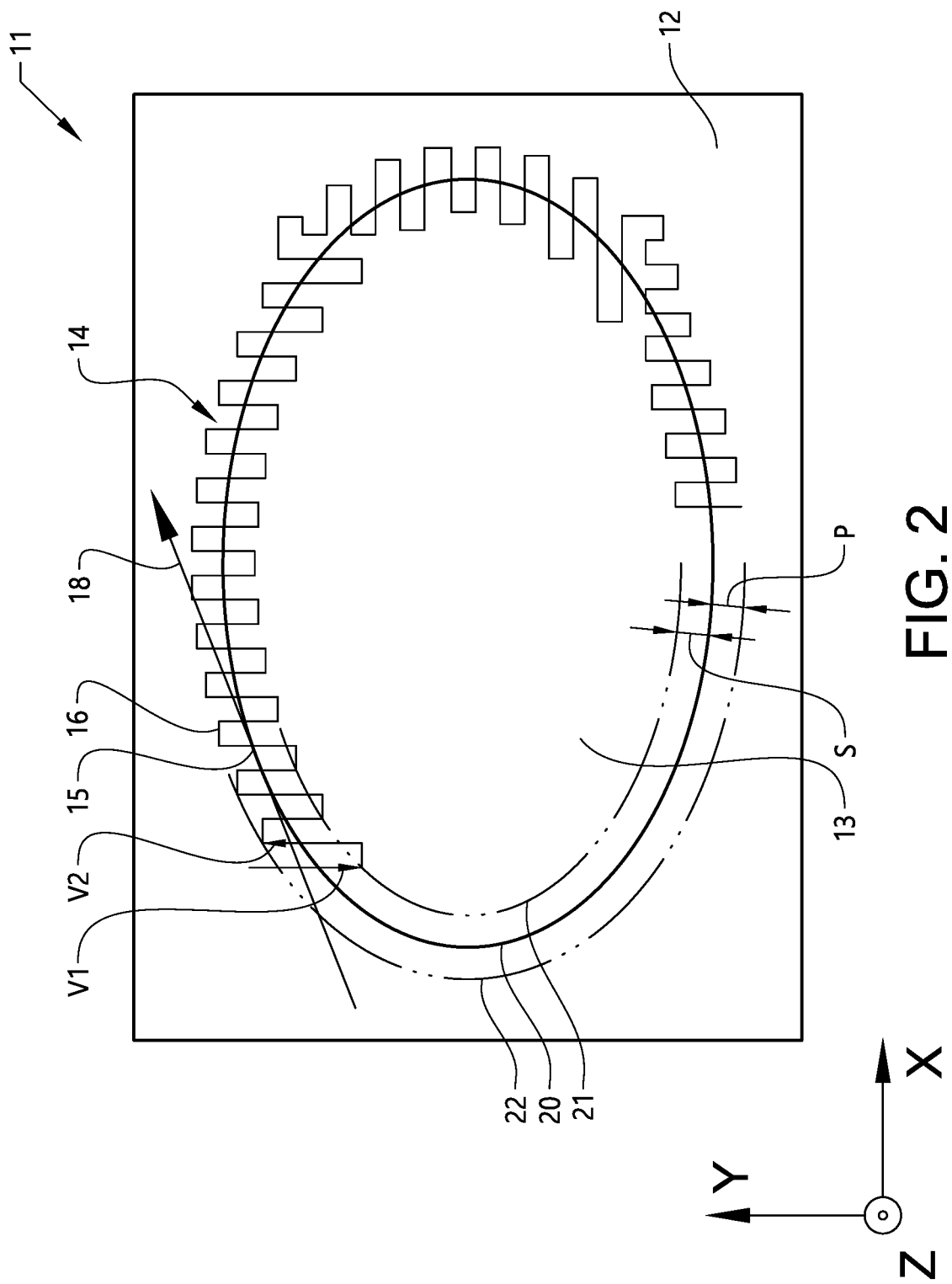
Figure 3:
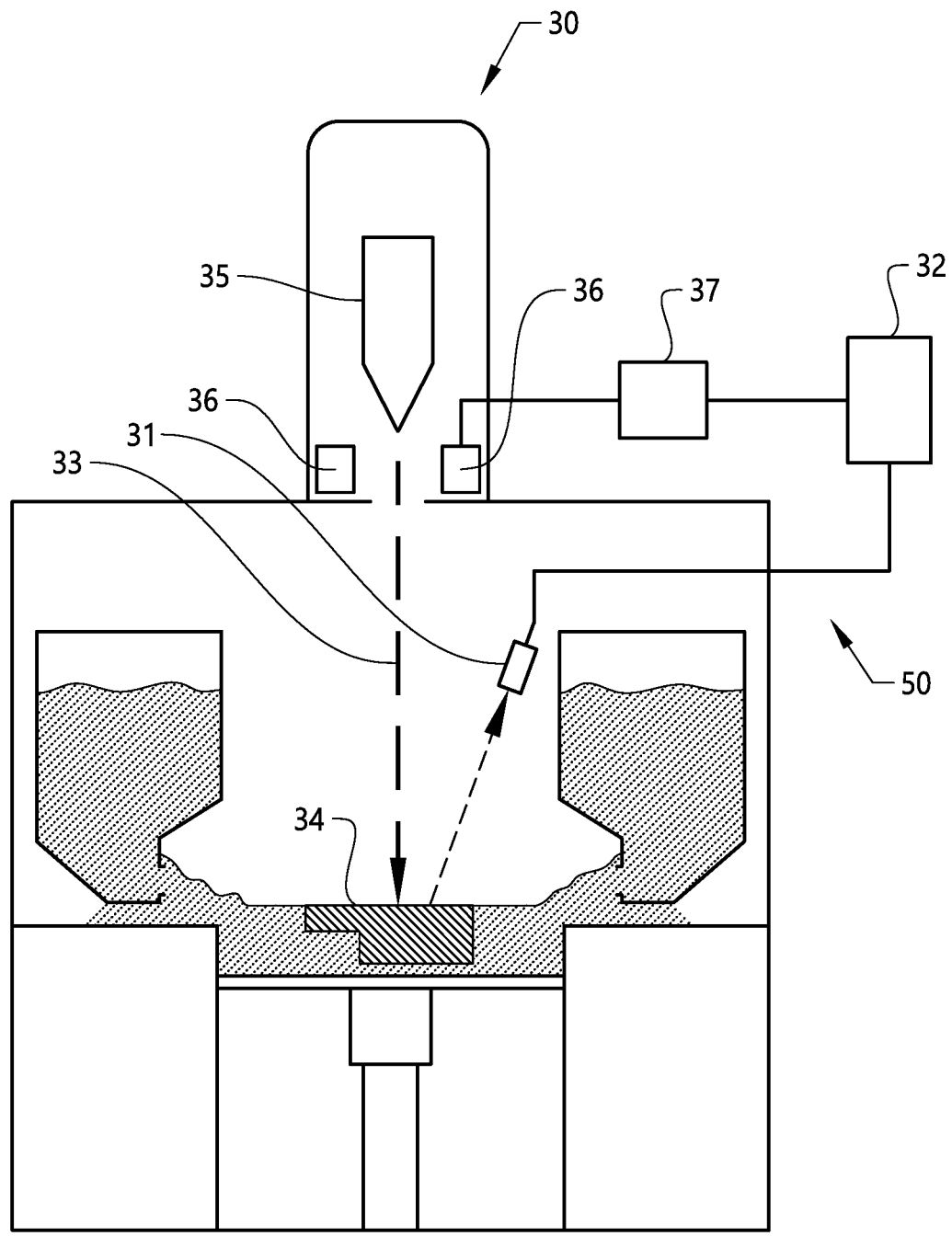
Figure 4:
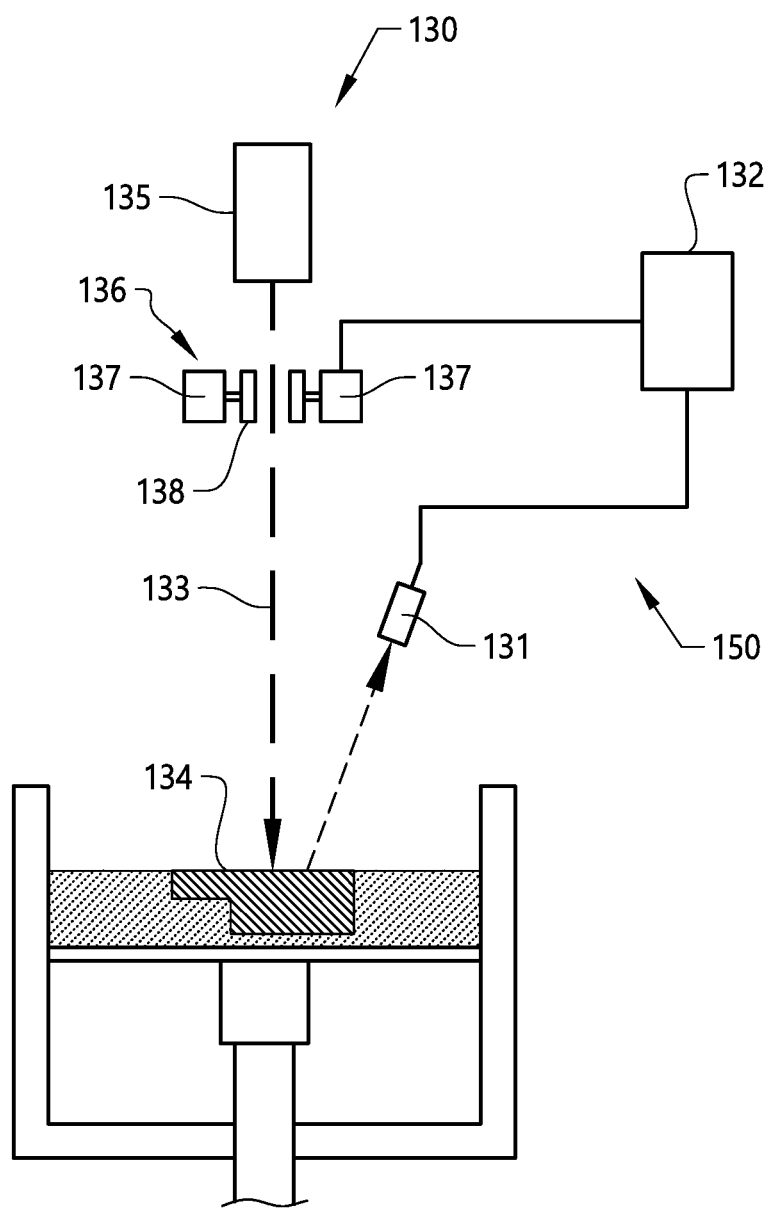
Figure 5:
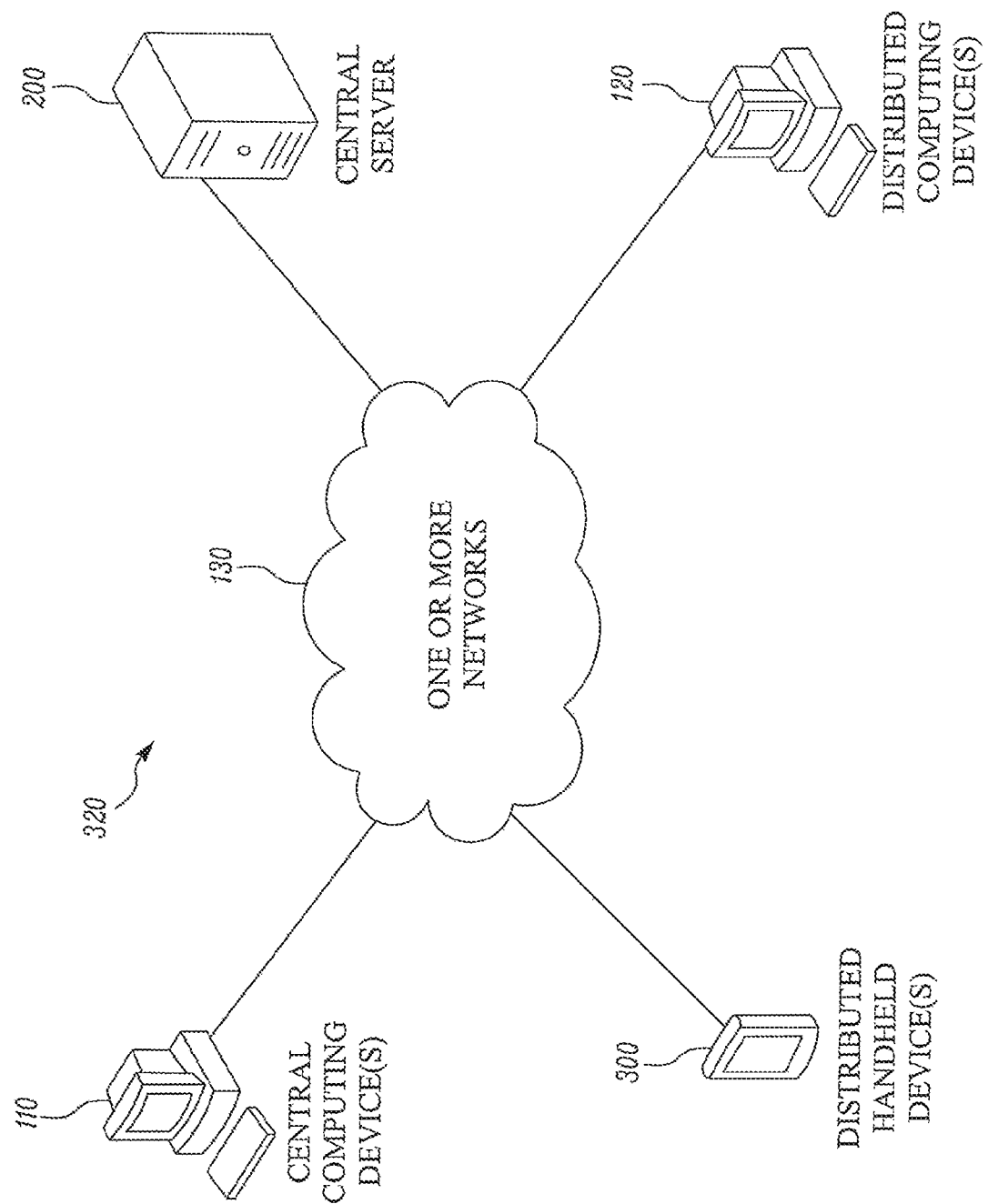
Figure 6:
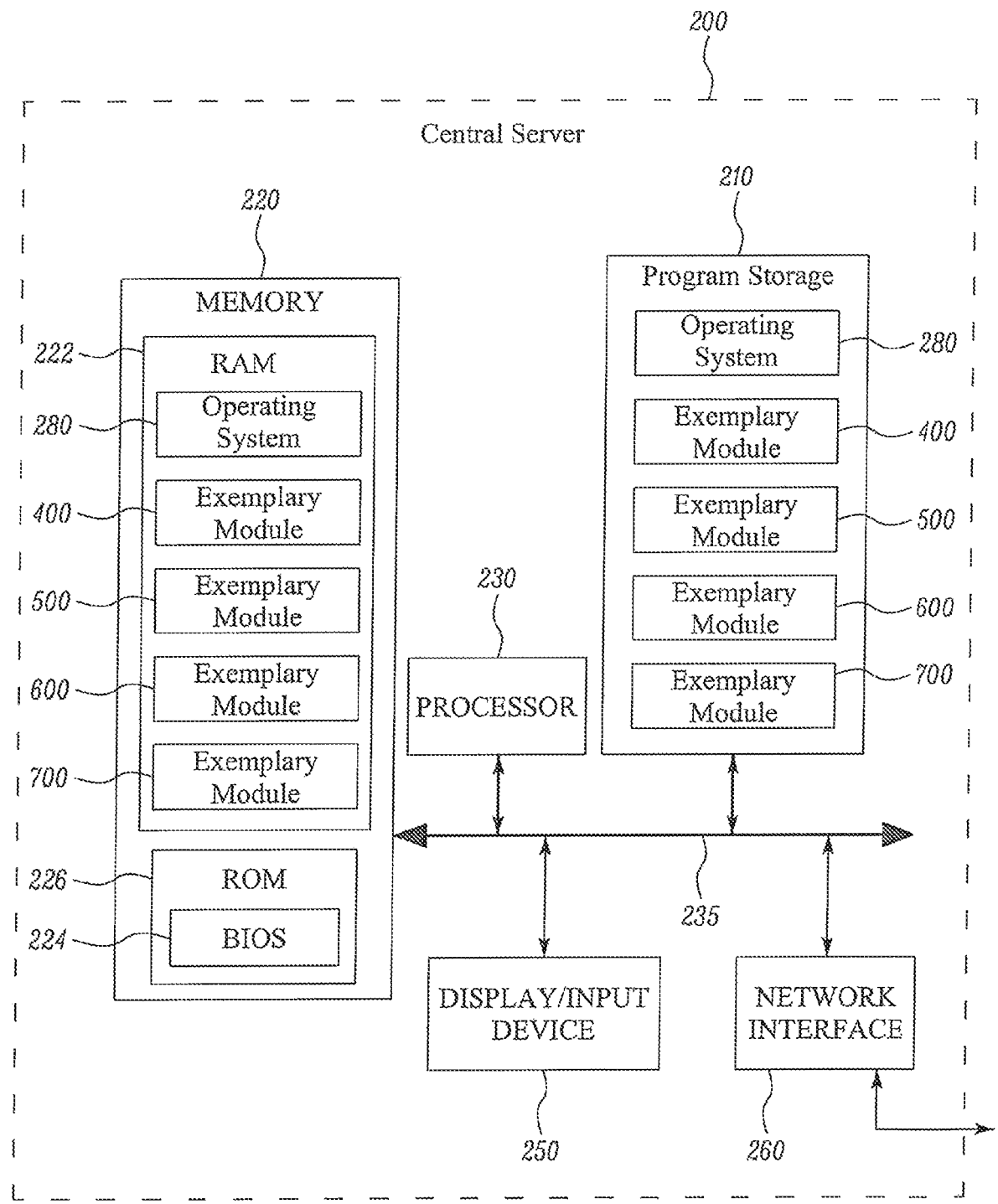
Figure 7:
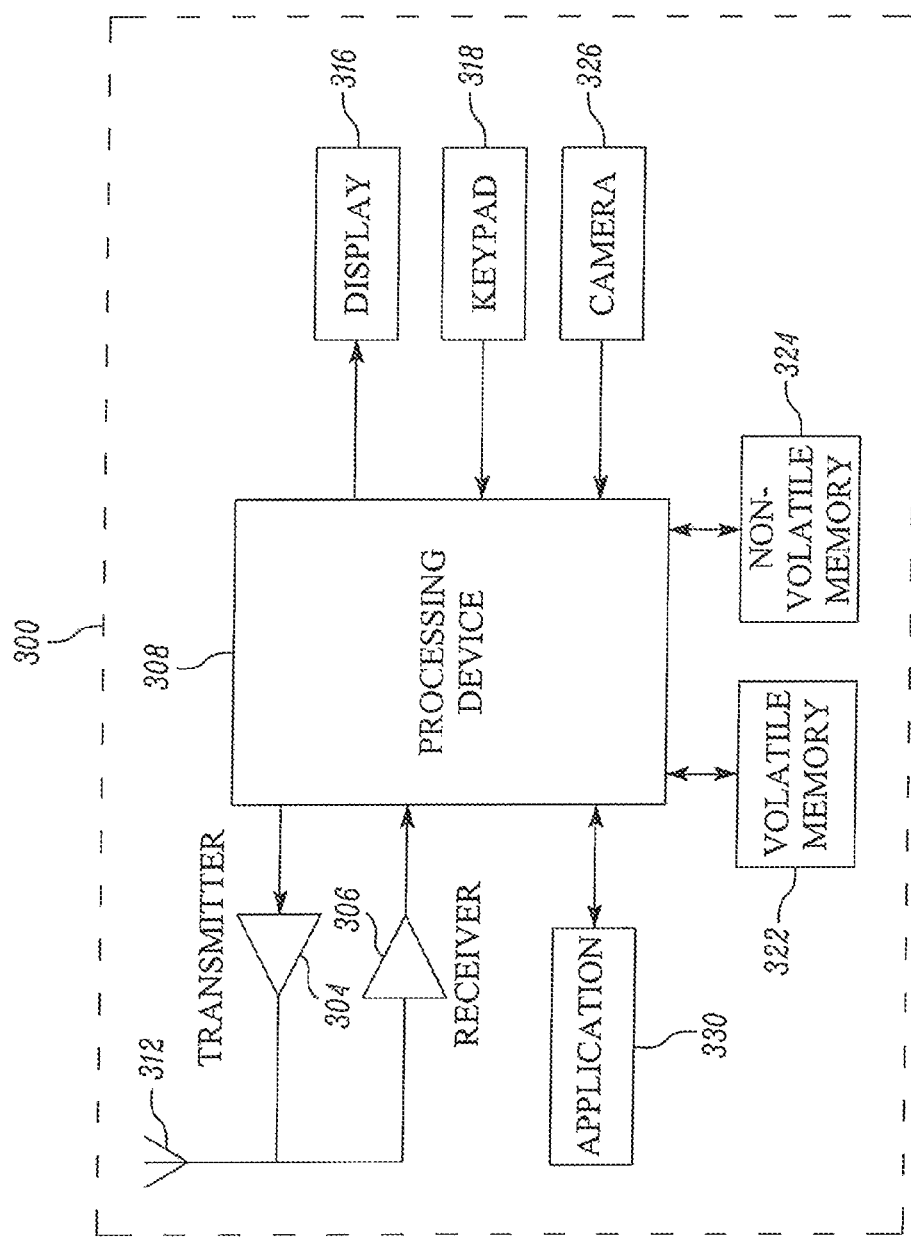

Having thus described the invention in general terms, reference will now be made to the accompanying drawings, which are not necessarily drawn to scale, and wherein:

FIG. 1 is a schematic view of a build layer and an indicated scanning pattern for an area of solid material;

FIG. 2 is a schematic view of a build layer and an indicated scanning pattern along a boundary between powder and solid material;

FIG. 3 is a schematic view showing an arrangement for an additive manufacturing machine comprising a control unit for controlling an electron beam, and an electron beam source;

FIG. 4 is a schematic view showing a further embodiment of an arrangement for an additive manufacturing machine comprising a control unit for controlling a laser beam, and a laser beam source;

FIG. 5 is a block diagram of an exemplary system according to various embodiments;

FIG. 6 is a schematic block diagram of an exemplary server according to various embodiments; and FIG. 7 is a schematic block diagram of an exemplary mobile device according to various embodiments.

DETAILED DESCRIPTION OF VARIOUS EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

FIG. 1 is a schematic view of a build layer 1 in an additive manufacturing (AM) machine. The build layer 1 is seen in the vertical direction in parallel with the Z-axis perpendicular to the XY-plane, whereas the main extension of the build layer 1 is in the XY-plane. The build layer 1 has a first section 2 of non-melted powder and a second section 3 of solid material formed by previously melted powder, i.e. the area inside the oval. The solid material constitutes one layer of a three-dimensional article being manufactured layer by layer in the AM machine. The AM machine is schematically illustrated in FIGS. 3 and 4.

It should be stressed that the build layer 1 may include non-melted powder, bonded powder and previously melted powder that has solidified.

The method described hereinafter is performed in an AM machine. Thus, the method is implemented when forming such a three-dimensional article layer by layer by successive fusion of selected areas of powder layers, which selected areas correspond to successive layers of the three-dimensional article. The equipment for melting the powder can be any suitable device for transferring energy to the selected areas, such as an electron beam source or laser source.

The method for analyzing the build layer can be performed before, after or in between such melting operations.

The method for analyzing the build layer 1, preferably the surface of the build layer, comprises the steps of radiating a portion 4 of the build layer 1 by an energy beam and detecting particles emitted, backscattered or reflected from the radiated portion of the build layer, and scanning the portion of the build layer by moving the energy beam along a main path 5 and simultaneously moving the energy beam back-and-forth across the main path in a meandering pattern 6. Thus, the radiation of the build layer is performed during scanning the portion 4 of the build layer and the portion 4 is determined by the scanning path.

Preferably, a portion of the top surface of the build layer is scanned. Although some information related to the structure inside of the build layers can be received, the method is primarily directed to the analysis of the properties of the surface and the material of the surface or immediately under the surface.

Such a meandering pattern 6 is illustrated in FIG. 1. The meandering pattern 6 shows the path 7 of the energy beam when the second section 3 of solid material is scanned for analysing the surface. The main path 5 has a direction 8 from left to the right in parallel with the X-axis. The energy beam path 7 is repeatedly crossing the main path 5 and has a direction component alternating between being directed downwards in parallel with the Y-axis and upwards in parallel with the Y-axis. In the embodiment illustrated in FIG. 1 the energy beam is moved in a continuous meandering pattern 6.

The energy beam can be moved in the meandering pattern 6 having alternating peaks 9 and valleys 10. Although a square wave shaped meandering pattern is illustrated and described hereinafter, also other meandering patterns could be used, such as a sinusoidal, triangle or sick-sack shaped pattern. A distance in a direction orthogonal to the direction of the main path between a peak and a subsequent valley of the meandering pattern is indicated by "y", and a distance in parallel with the direction of the main path between two consecutive peaks of the meandering pattern is indicated by "x".

The distance y is dependent on the size and shape of the surface portion to be analysed, but is preferably in the range 1 mm<y<100 mm, more preferably 2 mm<y<50 mm, and often in the range 4 mm<y<10 mm.

The distance x is dependent on the detection resolution required and is preferably in the range 2 μm<x<1000 μm, more preferably in the range 5 μm<x<500 μm, and often in the range 10 μm<x<100 μm.

In the example embodiment illustrated in FIG. 1, the method comprises the step of moving the energy beam in alternating directions in parallel vectors V1, V2 crossing the main path 5, and moving the energy beam in the parallel vectors V1, V2 being orthogonal to the direction 8 of the main path 5. The expressions "parallel" and "orthogonal" are meant to comprise also such patterns where the vectors V1, V2 are substantially parallel to each other and substantially orthogonal to the main path, including small angle deviations in the size of 0-20°, preferably 0-10°, and more preferably 0-5°, from the current directions.

The meandering pattern 6 has a plurality of first scan vectors V1 directed downwardly in parallel with the Y-axis and a plurality of second scan vectors V2 directed upwardly in parallel with the Y-axis in FIG. 1. In the main path direction 8, each first vector V1 is followed by one second vector V2 that is followed by one first vector V1, etc. Each vector V1, V2 can be connected to the adjacent vectors. In other words; between two adjacent vectors the energy beam is moved in the main path direction 8. As illustrated in FIG. 1, starting from the left side of the surface portion 4 to be scanned, the energy beam is moved downwards in parallel with the Y-axis forming a vector V1, then from left to right along the main path direction 8, thereafter upwards in parallel with the Y-axis forming a vector V2, and again from left to right along the main path direction 8. This sequence is then repeated until the surface portion is properly scanned. The length of the first and second vectors V1, V2 may vary among themselves along the main path 5 depending on the shape of the surface portion to be analysed. The distance between two adjacent vectors is selected based on the resolution requirement as previously described, and preferably the distance between two adjacent vectors V1, V2 is in the range 1-500 μm.

FIG. 2 shows another meandering pattern 16 associated to a further example embodiment where the method comprises the step of moving the energy beam along the main path 15 being selected on the basis of a boundary 20 between a previously melted and solidified section 13 and a non-melted section 12 of the build layer 11. The energy beam is preferably moved such that the main path 15 substantially follows the boundary 20, although the main path can be selected on the basis of the boundary, but the energy beam is moved somewhat differently. For example, the main path can be off-set relative to the boundary but still follow the contour of the boundary. Then the non-melted powder on one side of the boundary and/or the solid material on the other side of the boundary can be scanned. In another example embodiment, the main path can oscillate about the boundary.

As illustrated in FIG. 2, the main path 15 can preferably follow the boundary 20. Thus, the main path direction 18 is not constant but varies along the boundary 20 in accordance with the direction changes of the boundary. As was described with reference to FIG. 1, the meandering pattern has first vectors V1 and second vectors V2. These vectors V1, V2 are preferably parallel to each other. Although the vectors can be substantially orthogonal to the main path, they don't need to always be orthogonal to the main path 15. In this embodiment, the vectors have instead a direction along a first axis or a second axis, where the first axis and the second axis are substantially perpendicular to each other. As illustrated, these two axes can be the Y-axis and the X-axis. In the upper and lower portions of the boundary 20 illustrated in FIG. 2, the vectors extend in a direction in parallel with the Y-axis and in the right portion of the boundary 20, the vectors extend in a direction in parallel with the X-axis. By moving the energy beam along only one of two axes at a time, in parallel with the X-axis or the Y-axis, the control of the energy beam is simplified. Optionally, the directions of the X- and Y-axis can be selected differently.

The vectors can be adapted to the size of the surface portion to be analysed. In this case, the length of each vector and the position of each vector relative to the boundary 20, can be selected for scanning the desired area. Each vector can be divided into a vector part extending from the boundary 20 to a position on the solid layer inside of the boundary 20 and a vector part extending from the boundary 20 to a position on the non-melted powder outside of the boundary 20. For example, the vectors can extend between an inner imagined line 21 and an outer imagined line 22, where the distance S between the inner line 21 and the boundary is in the range 1-5 mm for instance, and the distance P between the boundary 20 and the outer line 22 is in the range 1-5 mm for instance. The imagined inner and outer lines 21, 22 may have substantially the same shape as the boundary 20.

The example embodiments described herein may comprise the step of moving the energy beam along the main path 5, 15 being selected on the basis of a path along which an electron beam or laser beam has been previously moved for melting the powder layer. Particularly, the energy beam can be moved along the main path 5, 15 which substantially follows a path along which an electron beam or a laser beam has been previously moved for melting the powder bed. This will simplify the control of the energy beam, particularly if the same energy beam source is used for both melting and/or pre-heating powder and for subsequently radiating the build layer surface for analyzing purposes.

In FIG. 3 an arrangement 50 for an AM machine is schematically illustrated. The arrangement comprises a control unit 32 and a particle detector device 31. In addition, an electron beam source 30 is schematically illustrated. In this example embodiment, the control unit 32 is arranged for controlling an electron beam 33 for analysing a surface of a build layer 34 by radiating a portion of the surface of the build layer by the electron beam and detecting electrons emitted or back-scattered from the radiated portion of the build layer by the particle detector device 31. The control unit 32 is configured to control the electron beam 33 to move along a main path and simultaneously back-and-forth across the main path in a meandering pattern as previously described hereinabove.

The electron beam source 30 can be designed in a way well known to the person skilled in the art. The electron beam source may have an electron gun 35 with an emitter electrode which is connected to a high voltage circuit and a current source for accelerating electrons and releasing electrons from the emitter electrode. These electrons form the electron beam 33. The electron beam source 30 has also focusing coils and deflection coils 36 for directing the electron beam to various positions of the build layer surface. The electron beam source 30 has further deflection amplifiers 37 connected to the deflection coils 36.

During scanning, the portion of the build layer to be analysed is radiated by an electron beam that can have a beam current D3 in the range $1\ \mu A < M < 1000\ \mu A$, preferably in the range $5\ \mu A < IB < 500\ \mu A$, and often in the range $10\ \mu A < IB < 100\ \mu A$. It should be stressed that such an electron beam will transfer significantly less energy to the surface than the energy required for melting the powder. For the electron beam, the beam power PB can be in the range $5\ mW < PB < 50000\ mW$, preferably in the range $500\ mW < PB < 5000\ mW$.

The deflecting coils 36 and the deflection amplifiers 37 are schematically illustrated in FIG. 3. The control unit 32 controls the electron beam 33 by transmitting signals to the deflection coils 36 via the deflection amplifiers 37. Hereby, the point or spot of the electron beam 33 positioned on the build layer surface can be moved in the meandering pattern.

The detected particles can be for example back-scattered electrons originating from the electron beam source 30 or secondary electrons emitted from the material of the build layer surface. The particle detector device 31 may use any suitable equipment for detecting electrons. For example, the particle detector device can have an additional bias voltage for selective detection of the electrons. The particle detector device 31 can generate data signals to be transmitted to the control unit 32. The data can be further processed and utilized for different analysis, for example creating images of the build layer surface for identifying defects or anomalies.

Although the particle detector device preferably is an electron detector device 31, it would also be possible to use a photon detector device, since photons can be emitted from the build layer surface as a physical reaction to the target materials intrinsic interaction with the absorbed energy from the electron beam 33. In such a case, a photon detector device may use any suitable equipment, such as for example photodiode, phototransistor, CCD, CMOS, PMT or similar.

The control unit 32 may comprise one or more microprocessors and/or one or more memory devices or any other components for executing computer programs to perform the method. Thus, the control unit 32 is preferably provided with a computer program for performing all steps of any embodiment of the method described hereinabove. The control unit can be a separate component or be integrated in another controller. The control unit can be arranged to control other parameters of the energy beam source, such as the energy beam current or the energy beam power. The control unit 32 can be part of a controller used also for other functions of the AM machine, such as movement of the build plate, control of a powder distribution device, etc.

The arrangement 50 for an AM machine and the control unit 32 itself can be combined with any of the features disclosed hereinabove, for example discussed with reference to the method and/or related to the AM machine. In another aspect of the invention there is provided a program element configured and arranged when executed on a computer (e.g., via a computer program) to implement the method described herein. The program element may be installed in a non-transitory computer readable storage medium. The computer readable storage medium may be the control unit 32 or on another control unit. The computer readable storage medium and the program element, which may comprise computer-readable program code portions embodied therein, may further be contained within a computer program product or a computer program, as described previously.

In FIG. 4 a further example embodiment of an arrangement 150 for an AM machine is schematically illustrated. The arrangement 150 comprises a control unit 132 and a particle detector device in form of a photon detector device 131. In addition, a laser beam source 130 is schematically illustrated. The control unit 132 is arranged for controlling a laser beam 133 for analysing a surface of a build layer 134 by radiating a portion of the surface of the build layer by the laser beam and detecting photons emitted or reflected from the radiated portion of the build layer by the photon detector device 131. The control unit 132 is configured to control the laser beam 133 to move along a main path and simultaneously back-and-forth across the main path in a meandering pattern as previously described hereinabove.

The laser beam source 130 can be designed in a way well known to the person skilled in the art. The laser beam source may have a laser emitter 135 for emitting photons. These photons form the laser beam 133. The laser beam source 130 has also focusing units and deflection units 136 for directing the laser beam to various positions of the build layer surface. The focusing units can comprise lenses. Each deflection unit 136 may comprise a deflection actuator 138 and a deflection driver 137 for controlling the movement of the deflection actuator 138. The deflection actuators 138 are suitably mirrors.

The deflecting actuators 138 and the deflection drivers 137 are schematically illustrated in FIG. 4. The control unit 132 controls the laser beam 133 by transmitting signals to the deflection drivers 137. Hereby, the point or spot of the laser beam 133 positioned on the build layer surface can be moved in the meandering pattern.

It should be stressed that the laser beam 133 will transfer significantly less energy to the surface than the energy required for melting the powder. For example, the laser beam power PB can be in the range 100 mW<PB<1000 mW.

The detected photons can be reflected or backscattered photons originating from the laser beam. The photon detector device 131 may use any suitable equipment, such as for example photodiode, phototransistor, CCD, CMOS, PMT or similar. The photon detector device 131 can generate data signals to be transmitted to the control unit 132. The data can be further processed and utilized for different analysis, for example creating images of the build layer surface for identifying defects or anomalies.

In another aspect of the invention it is provided a program element configured and arranged when executed on a computer to implement a method as described herein. The program element may be installed in a computer readable storage medium. The computer readable storage medium may be any one of the control units described elsewhere herein or another and separate control unit, as may be desirable. The computer readable storage medium and the program element, which may comprise computer-readable program code portions embodied therein, may further be contained within a non-transitory computer program product. Further details regarding these features and configurations are provided, in turn, below.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

FIG. 5 is a block diagram of an exemplary system 320 that can be used in conjunction with various embodiments of the present invention. In at least the illustrated embodiment, the system 320 may include one or more central computing devices 110, one or more distributed computing devices 120, and one or more distributed handheld or mobile devices 300, all configured in communication with a central server 200 (or control unit) via one or more networks 130. While FIG. 5 illustrates the various system entities as separate, stand-alone entities, the various embodiments are not limited to this particular architecture.

According to various embodiments of the present invention, the one or more networks 130 may be capable of supporting communication in accordance with any one or more of a number of second-generation (2G), 2.5G, third-generation (3G), and/or fourth-generation (4G) mobile communication protocols, or the like. More particularly, the one or more networks 130 may be capable of supporting communication in accordance with 2G wireless communication protocols IS-136 (TDMA), GSM, and IS-95 (CDMA). Also, for example, the one or more networks 130 may be capable of supporting communication in accordance with 2.5G wireless communication protocols GPRS, Enhanced Data GSM Environment (EDGE), or the like. In addition, for example, the one or more networks 130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 320 may be configured to communicate with one another in accordance with techniques such as, for example, radio frequency (RF), Bluetooth™, infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 110-300 are illustrated in FIG. 5 as communicating with one another over the same network 130, these devices may likewise communicate over multiple, separate networks.

According to one embodiment, in addition to receiving data from the server 200, the distributed devices 110, 120, and/or 300 may be further configured to collect and transmit data on their own. In various embodiments, the devices 110, 120, and/or 300 may be capable of receiving data via one or more input units or devices, such as a keypad, touchpad, barcode scanner, radio frequency identification (RFID) reader, interface card (e.g., modem, etc.) or receiver. The devices 110, 120, and/or 300 may further be capable of storing data to one or more volatile or non-volatile memory modules, and outputting the data via one or more output units or devices, for example, by displaying data to the user operating the device, or by transmitting data, for example over the one or more networks 130.

In various embodiments, the server 200 includes various systems for performing one or more functions in accordance with various embodiments of the present invention, including those more particularly shown and described herein. It should be understood, however, that the server 200 might include a variety of alternative devices for performing one or more like functions, without departing from the spirit and scope of the present invention. For example, at least a portion of the server 200, in certain embodiments, may be located on the distributed device(s) 110, 120, and/or the handheld or mobile device(s) 300, as may be desirable for particular applications. As will be described in further detail below, in at least one embodiment, the handheld or mobile device(s) 300 may contain one or more mobile applications 330 which may be configured so as to provide a user interface for communication with the server 200, all as will be likewise described in further detail below.

FIG. 6 is a schematic diagram of the server 200 according to various embodiments. The server 200 includes a processor 230 that communicates with other elements within the server via a system interface or bus 235. Also included in the server 200 is a display/input device 250 for receiving and displaying data. This display/input device 250 may be, for example, a keyboard or pointing device that is used in combination with a monitor. The server 200 further includes memory 220, which typically includes both read only memory (ROM) 226 and random access memory (RAM) 222. The server's ROM 226 is used to store a basic input/output system 224 (BIOS), containing the basic routines that help to transfer information between elements within the server 200. Various ROM and RAM configurations have been previously described herein.

In addition, the server 200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 210 are connected to the system bus 235 by an appropriate interface. The storage devices 210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 210 and/or memory of the server 200 may further provide the functions of a data storage device, which may store historical and/or current delivery data and delivery conditions that may be accessed by the server 200. In this regard, the storage device 210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 400-700) comprising, for example, one or more computer-readable program code portions executable by the processor 230, may be stored by the various storage devices 210 and within RAM 222. Such program modules may also include an operating system 280. In these and other embodiments, the various modules 400, 500, 600, 700 control certain aspects of the operation of the server 200 with the assistance of the processor 230 and operating system 280. In still other embodiments, it should be understood that one or more additional and/or alternative modules may also be provided, without departing from the scope and nature of the present invention.

In various embodiments, the program modules 400, 500, 600, 700 are executed by the server 200 and are configured to generate one or more graphical user interfaces, reports, instructions, and/or notifications/alerts, all accessible and/or transmittable to various users of the system 320. In certain embodiments, the user interfaces, reports, instructions, and/or notifications/alerts may be accessible via one or more networks 130, which may include the Internet or other feasible communications network, as previously discussed.

In various embodiments, it should also be understood that one or more of the modules 400, 500, 600, 700 may be alternatively and/or additionally (e.g., in duplicate) stored locally on one or more of the devices 110, 120, and/or 300 and may be executed by one or more processors of the same. According to various embodiments, the modules 400, 500, 600, 700 may send data to, receive data from, and utilize data contained in one or more databases, which may be comprised of one or more separate, linked and/or networked databases.

Also located within the server 200 is a network interface 260 for interfacing and communicating with other elements of the one or more networks 130. It will be appreciated by one of ordinary skill in the art that one or more of the server 200 components may be located geographically remotely from other server components. Furthermore, one or more of the server 200 components may be combined, and/or additional components performing functions described herein may also be included in the server.

While the foregoing describes a single processor 230, as one of ordinary skill in the art will recognize, the server 200 may comprise multiple processors operating in conjunction with one another to perform the functionality described herein. In addition to the memory 220, the processor 230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

FIG. 7 provides an illustrative schematic representative of a mobile device 300 that can be used in conjunction with various embodiments of the present invention. Mobile devices 300 can be operated by various parties. As shown in FIG. 7, a mobile device 300 may include an antenna 312, a transmitter 304 (e.g., radio), a receiver 306 (e.g., radio), and a processing element 308 that provides signals to and receives signals from the transmitter 304 and receiver 306, respectively.

The signals provided to and received from the transmitter 304 and the receiver 306, respectively, may include signaling data in accordance with an air interface standard of applicable wireless systems to communicate with various entities, such as the server 200, the distributed devices 110, 120, and/or the like. In this regard, the mobile device 300 may be capable of operating with one or more air interface standards, communication protocols, modulation types, and access types. More particularly, the mobile device 300 may operate in accordance with any of a number of wireless communication standards and protocols. In a particular embodiment, the mobile device 300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 300 may according to various embodiments communicate with various other entities using concepts such as Unstructured Supplementary Service data (USSD), Short Message Service (SMS), Multimedia Messaging Service (MIMS), Dual-Tone Multi-Frequency Signaling (DTMF), and/or Subscriber Identity Module Dialer (SIM dialer). The mobile device 300 can also download changes, add-ons, and updates, for instance, to its firmware, software (e.g., including executable instructions, applications, program modules), and operating system.

According to one embodiment, the mobile device 300 may include a location determining device and/or functionality. For example, the mobile device 300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 300 may also comprise a user interface (that can include a display 316 coupled to a processing element 308) and/or a user input interface (coupled to a processing element 308). The user input interface can comprise any of a number of devices allowing the mobile device 300 to receive data, such as a keypad 318 (hard or soft), a touch display, voice or motion interfaces, or other input device. In embodiments including a keypad 318, the keypad can include (or cause display of) the conventional numeric (0-9) and related keys (#, *), and other keys used for operating the mobile device 300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 300 can also include volatile storage or memory 322 and/or non-volatile storage or memory 324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 300.

The mobile device 300 may also include one or more of a camera 326 and a mobile application 330. The camera 326 may be configured according to various embodiments as an additional and/or alternative data collection feature, whereby one or more items may be read, stored, and/or transmitted by the mobile device 300 via the camera. The mobile application 330 may further provide a feature via which various tasks may be performed with the mobile device 300. Various configurations may be provided, as may be desirable for one or more users of the mobile device 300 and the system 320 as a whole.

The invention is not limited to the above-described embodiments and many modifications are possible within the scope of the following claims. Indeed, a person of ordinary skill in the art would be able to use the information contained in the preceding text to modify various embodiments of the invention in ways that are not literally described, but are nevertheless encompassed by the attached claims, for they accomplish substantially the same functions to reach substantially the same results. Therefore, it is to be understood that the invention is not limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method for analyzing a build layer (1; 11) in an additive manufacturing machine when forming a three-dimensional article layer by layer by successive fusion of selected areas of powder layers, which selected areas correspond to successive layers of the three-dimensional article, the method comprising the steps of:
   radiating a portion (4; 14) of the build layer (1; 11) by an energy beam,
   detecting particles emitted, backscattered or reflected from the radiated portion of the build layer, and
   scanning the portion (4; 14) of the build layer by moving the energy beam along a main path (5; 15) and simultaneously moving the energy beam back-and-forth across the main path in a meandering pattern (6; 16) having alternating peaks (9) and valleys (10), such that a distance in a direction orthogonal to the direction (8) of the main path (5) between a peak and a subsequent valley of the meandering pattern is y, where $1<y<100$ mm, and a distance in parallel with the direction of the main path between two consecutive peaks of the meandering pattern is x, where $2<x<1000$ μm.

2. The method according to claim 1, wherein the moving of the energy beam along the main path (15) is selected on the basis of a boundary (20) between a previously melted section and a non-melted section of the build layer (11).

3. The method according to claim 1, wherein the moving of the energy beam along the main path (15) occurs substantially following a boundary (20) between a previously melted section and a non-melted section of the build layer (11).

4. The method according to claim 1, wherein the moving of the energy beam along the main path (5; 15) is selected on the basis of a path along which an electron beam or a laser beam has been previously moved for melting the build layer (1; 11).

5. The method according to claim 1, wherein the moving of the energy beam along the main path (5; 15) occurs substantially following a path along which an electron beam or a laser beam has been previously moved for melting the build layer (1; 11).

6. The method according to claim 1, wherein the moving of the energy beam occurs in a continuous meandering pattern (6; 16).

7. The method according to claim 1, wherein the moving of the energy beam occurs such that a non-melted section (12) of the build layer is radiated for detecting particles emitted, backscattered or reflected from the non-melted section.

8. The method according to claim 1, wherein the moving of the energy beam occurs such that a previously melted and solidified section (3; 13) of the build layer is radiated for detecting particles emitted, backscattered or reflected from the previously melted and solidified section.

9. The method according to claim 1, wherein y is 2<y<50 mm and x is 5<x<500 µm.

10. The method according to claim 1, wherein y is 4<y<10 mm and x is 10<x<100 µm.

11. The method according to claim 1, wherein the moving of the energy beam occurs in alternating directions in parallel vectors (V1, V2) crossing the main path (5; 15).

12. The method according to claim 11, wherein the moving of the energy beam in the parallel vectors (V1, V2) is orthogonal to the direction of the main path (5).

13. The method according to claim 11, wherein the moving of the energy beam in the meandering pattern (6; 16) is substantially square wave shaped.

14. The method according to claim 1, wherein the energy beam is an electron beam (33).

15. The method according to claim 14, further comprising the step of detecting at least one of back-scattered electrons or secondary electrons emitted from the build layer (1; 11).

16. The method according to claim 14, further comprising the step of radiating the portion (4; 14) of the build layer by the electron beam (33), wherein the electron beam (33) has a beam current $I_B$ in the range $1 < I_B < 1000$ µA.

17. The method according to claim 16, wherein the beam current is $5 < I_B < 500$ µA.

18. The method according to claim 16, wherein the beam current is $10 < I_B < 100$ µA.

19. An arrangement (50; 150) for an additive manufacturing machine, the arrangement comprising:
   an energy beam (33; 133) configured to radiate a portion (4; 14) of a build layer (1; 11; 34; 134);
   a particle detector device (31; 131) for detecting particles emitted, backscattered or reflected from the build layer (1; 11; 34; 134) in the additive manufacturing machine; and
   a control unit (32; 132),
   wherein the control unit (32; 132) is configured to:
      detect particles emitted, backscattered or reflected from the radiated portion of the build layer, and
      move the energy beam (33; 133) along a main path (5; 15) and simultaneously back-and-forth across the main path in a meandering pattern (6; 16) having alternating peaks (9) and valleys (10), such that a distance in a direction orthogonal to the direction (8) of the main path (5) between a peak and a subsequent valley of the meandering pattern is y, where $1 < y < 100$ mm, and a distance in parallel with the direction of the main path between two consecutive peaks of the meandering pattern is x, where $2 < x < 1000$ µm.

20. A computer program product comprising at least one non-transitory computer-readable storage medium having computer-readable program code portions embodied therein, the computer-readable program code portions comprising one or more executable portions configured for performing the method according to claim 1.

21. A method for analyzing a build layer (1; 11) in an additive manufacturing machine when forming a three-dimensional article layer by layer by successive fusion of selected areas of powder layers, which selected areas correspond to successive layers of the three-dimensional article, the method comprising the steps of:
   radiating a portion (4; 14) of the build layer (1; 11) by an energy beam,
   detecting particles emitted, backscattered or reflected from the radiated portion of the build layer, and
   scanning the portion (4; 14) of the build layer by moving the energy beam along a main path (5; 15) and simultaneously moving the energy beam back-and-forth in alternating directions in parallel vectors (V1, V2) crossing the main path (5; 15) in a meandering pattern (6; 16) having a substantially square shape.

* * * * *